United States Patent [19]

Schade, Jr.

[11] 4,392,112
[45] Jul. 5, 1983

[54] LOW DRIFT AMPLIFIER

[75] Inventor: Otto H. Schade, Jr., North Caldwell, N.J.

[73] Assignee: RCA Corporation, New York, N.Y.

[21] Appl. No.: 300,121

[22] Filed: Sep. 8, 1981

[51] Int. Cl.³ .......................... H03F 3/45; H03F 1/02
[52] U.S. Cl. ........................................ 330/252; 330/9
[58] Field of Search ............... 330/252, 261, 9, 124 D, 330/51

[56] References Cited

U.S. PATENT DOCUMENTS

| | | | |
|---|---|---|---|
| 3,982,172 | 9/1976 | Van de Plassche | 323/1 |
| 4,068,182 | 1/1978 | Dingwall et al. | 330/9 |
| 4,138,649 | 2/1979 | Schaffer | 330/9 |
| 4,185,236 | 1/1980 | Van de Plassche | 323/1 |
| 4,225,816 | 9/1980 | Schade, Jr. | 323/4 |
| 4,263,519 | 4/1981 | Schade, Jr. | 307/297 |

OTHER PUBLICATIONS

"A CMOS A/D Converter Circuit for Thermocouple Temp Measurement", 1981 IEEE International Solid State Circuits Conference, p. 60, Digest of Technical Papers.

Primary Examiner—James B. Mullins
Assistant Examiner—Gene Wan
Attorney, Agent, or Firm—E. M. Whitacre; P. J. Rasmussen; E. P. Herrmann

[57] ABSTRACT

A differential amplifier is arranged to exhibit substantially no D.C. offset or drift. Input signal is alternately connected to the non-inverting and inverting input terminals of an input differential stage. Synchronously therewith the differential output signals of the differential stage are interchanged to maintain the sense of the output signal constant. The synchronous interchanging of differential input and differential output signals tends to average out parameter offset in the input circuit elements. The differential input stage is provided with a substantially balanced active current mirror load. The current mirror load devices are commutated with respect to the input devices to further reduce amplifier offset arising inherently in the differential stage load elements. The commutation of the current mirror load elements is performed at a rate which is a multiple of the rate at which the input and output signals are interchanged.

7 Claims, 3 Drawing Figures

LOW DRIFT AMPLIFIER

BACKGROUND OF THE INVENTION

This invention relates to amplifier circuitry and in particular to DC amplifiers exhibiting low-level voltage offset drift. Amplifiers of this type find application in generation stable reference potentials.

In the design of precision circuitry such as analog-to-digital (A/D) converters for example it is necessary to generate stable reference potentials against which the signal to be measured may be compared. The accuracy of such a reference for a 4000 count A/D must be in the order of 1 part in 10,000 and it must be relatively stable over a reasonable temperature range and during the lifetime of the device. Such references frequently employ differential amplifiers to measure potentials across like resistors indicative of the current conducted therethrough, the amplifier output potential being used in a feedback loop to readjust the currents for temperature induced changes. See for example U.S. Pat. No. 4,263,519 entitled "Bandgap Reference" (incorporated herein by reference). In order for the output potential of the reference to be stable, the amplifier must be substantially stable i.e. free of parameter drift which is reflected as a change in input offset.

Dingwall et al. (U.S. Pat. No. 4,068,182 entitled "Direct Coupled Cascade Amplifier With Automatically Adjusted Quiescent Output Signal Level" issued Jan. 10, 1978) designed an amplifier which is unaffected by elemental parameter drift by providing for periodic autozeroing of the amplifier. During autozero the amplifier input terminals are shorted, the concurrent consequent output being a measure of present amplifier offset. This offset is fed back internally, stored on a capacitor, and used to adjust amplifier gain until the next autozero interval. The shortcoming of the Dingwall et al arrangement is that the amplifier is effectively out of useful service during the autozero intervals. This becomes a relatively large percentage of the total time where a highly stable device is required.

Shaffer in U.S. Pat. No. 4,138,649 issued Feb. 6, 1979 entitled "Amplifier Systems" set forth a solution to amplifier offset in DC amplifiers which provides essentially for 100 percent duty cycle. This amplifier includes switches at the input and output stages for alternating the application of the input signal between the inverting and non-inverting input terminals and simultaneously interchanging the output signal between one of the two available differential output connections. Switching the signals is intended to average out the first stage equivalent offset signal. The Shaffer circuit only compensates for offsets in the amplifier differential input pair of devices i.e. the input emitter coupled (bipolar) or input source coupled (FET) long tail pair. Where imperfectly matched load devices are employed in the collector or drain connections of the input devices, further input-offset errors will be introduced. These load related errors not only limit the effectiveness of the offset correction process but in addition, it has been found that such load related offsets do not in fact generally remain constant. Consider, for example, that the active load elements generate an offset of 5 mV. In addition to this error if the offset drifts by only 5 percent a 0.25 mV shift will be generated. Consider, also, that it is desired to produce in a reference potential circuit a reference potential of 1 Volt stable to within 1 part in 10,000 or 0.1 mV. It is readily seen that a 0.25 mV shift is intolerable.

To eliminate amplifier offset and drift due to the active load elements of a differential amplifier, the Shaffer type amplifier has been improved by providing means to sequentially permutate the particular active load elements between the particular input transistors synchronously with the permutation or switching of the amplifier input and output connections. The 1/f or flicker noise generated at frequencies below the switching frequency is a time-varying parameter which is also averaged out by the process. The amplifier therefore also exhibits a lower flicker noise component in its output signal.

SUMMARY OF THE INVENTION

In accordance with this invention, an amplifier is provided including an input differential transistor pair having active load elements in their respective collector (drain) circuits. A first set of switch means is coupled to the inverting and non-inverting input connections of the input differential pair to periodically alternate the application of input signal between the input connections. A second set of switch means is connected to the collector (drain) electrodes of the input transistors to alternate connection of the collector (drain) electrodes to an amplifier output terminal synchronously with the alternation of said first switch means. A third set of switch means for permutating the imposition of the particular active load devices in the respective collector (drain) circuits of the input transistors. The third set of switch means is activated synchronously with the first and second sets of switch means but at a rate which is either twice or one half the rate of switching of the first and second sets. The synchronous permutation of input signal, output signal and circuit elements tends to average potential offsets of the various circuit elements with a concomitant reduction in both offset and drift of the steady state amplifier input potential.

IN THE DRAWINGS

DETAILED DESCRIPTION OF THE INVENTION

Figure 1:
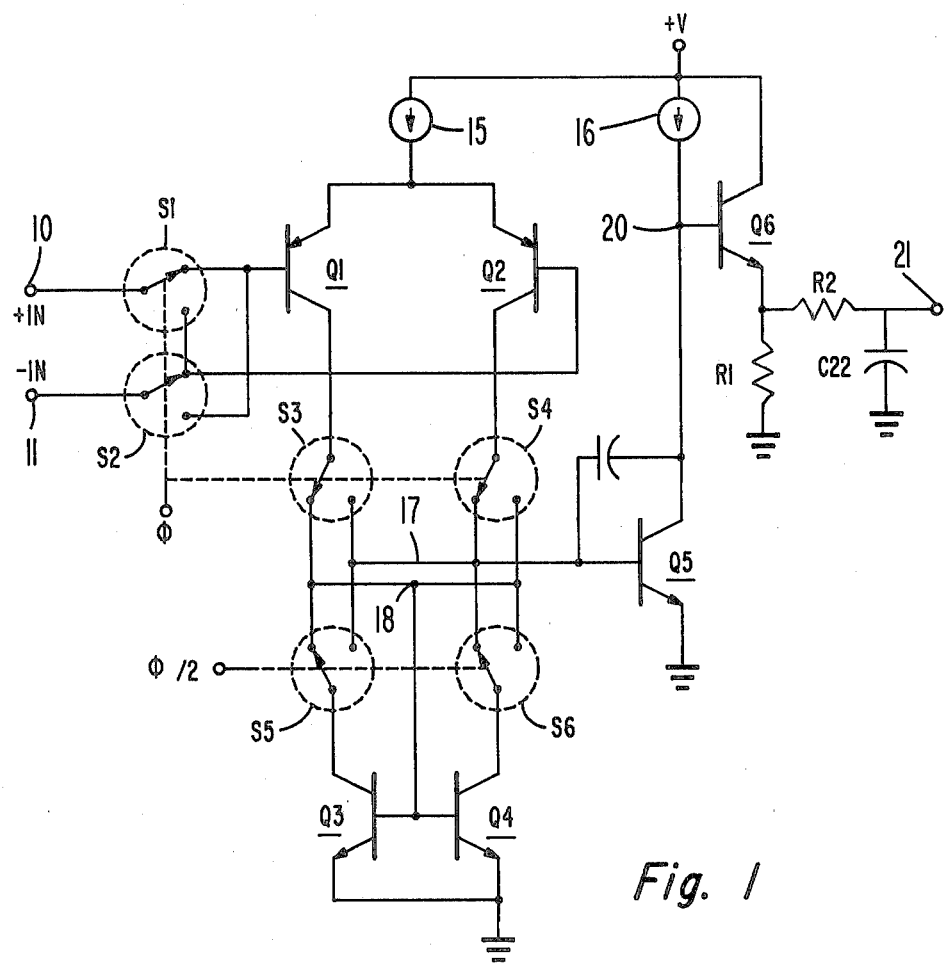
FIG. 1 is a schematic diagram of a differential amplifier embodying the present invention.

Referring to FIG. 1, transistors Q1 and Q2 have their emitter electrodes interconnected with current source 15 fo form a conventional differential or long tail pair. The output or collector electrodes of transistors Q1 and Q2 are respectively connected via switches S3-S6 to the collector electrodes of transistors Q3 and Q4. Transistors Q3 and Q4 having their emitter electrodes connected to reference potential and their base electrodes connected in common to the collector electrode of either Q3 or Q4 via switch S5 or S6 form a basic current mirror amplifier, or CMA. The CMA provides an active load for the Q1, Q2 differential pair to form a differential amplifier stage having a single ended output at connection 17.

Transistor Q5 and current source 16 from a common emitter amplifier in cascade connection with the differential stage for additional gain. The common emitter amplifier has an input connection at the differential stage output connection 17 and an output connection at 20. The common emitter amplifier output potential at connection 20 is buffered by an emitter follower amplifier comprised of transistor Q6 with resistor R1 in its emitter circuit. Output potential is available at terminal 21 connected to the emitter electrode of transistor Q6 via resistor R2, whose function is to buffer the more responsive amplifier from the ripple-smoothing capacitor C22. The capacitor C22 connected to output terminal 21 integrates or filters the output response of the amplifier relegating the amplifier to relatively low frequency operation. In the situation where the amplifier is incorporated in a potential reference circuit, the amplifier frequency response is limited to substantially DC.

The Q1, Q2 differential pair have their respective input or base electrodes connected to the amplifier input terminals by switches S1 and S2. Switches S1 and S2 may be realized, for example, by combinations of transistors like the RCA Corp. CD4016 integrated circuit quad analog switch array. The respective output or collector electrodes of the Q1, Q2 differential pair are alternately connected to the differential stage output connection 17 by switches S3 and S4. As per the Shaffer Patent switches S3 and S4 are synchronously energized by a clocked potential $\phi$ (preferably of 50 percent duty cycle) with switches S1 and S2 so that the input signal at terminals 10 and 11 is alternated between transistors Q1 and Q2 while maintaining the sense of the output signal constant, i.e. the signal at connection 17 is always inverted with respect to the signal applied to input terminal 10.

The alternation of input signals between transistors Q1 and Q2 and the alternation of the Q1, Q2 transistor output signals to output connection 17 tends to average out potential offsets due to transistors Q1 and Q2 as taught by Shaffer.

Transistor load Q4 is commutated between the collector circuit of transistor Q2 and the collector circuit of transistor Q1 by switches S6, S4 and S3. Concurrently transistor load Q3 is commutated between the collector circuit of transistor Q1 and the collector circuit of transistor Q2 by switches S5, S3 and S4. In addition the common base connection 18 of transistors Q3 and Q4 is commutated between the collector electrodes of transistors Q3 and Q4 to maintain the sense of the output signal constant. Note, however, that the common base connection 18 may be alternatively biased by a constant potential by configuring transistors Q3 and Q4 as current source loads and thus obviating the need for commutating connection 18 (although Q3 and Q4 must still be commutated) as in FIG. 1.

It can be seen from the figure that operating switches S3 and S4 in unison with switches S5 and S6 will result in the respective load transistors being constantly connected in the same collector circuit with one of the differential pair transistors Q1 or Q2 defeating the intended purpose of commutating the load devices between transistors Q1 and Q2 to average out any load device induced offset. Therefore, switches S5 and S6 are switched at a multiple or a submultiple of the rate at which switches S1-S4 are operated. If ripple is to be filtered, the fastest switching rate would normally be assigned to the part of the circuit which produces the greatest offset error or drift. Consider that S5 and S6 are operated at twice the rate as switches S3 and S4. During a half cycle of switches S3 and S4 switches S5 and S6 will undergo a full cycle of operation. Thus, during each half cycle of switches S3 and S4 transistor Q3 will be connected for a quarter cycle to the collector of transistor Q1 and for a quarter cycle to the collector of transistor Q2. Transistor Q4 will be similarly alternately connected to the collectors of Q2 and Q1. The load seen by both transistors Q1 and Q2 is the time averaged load presented by transistors Q3 and Q4. Any offset occurring due to load transistors Q3 and Q4 is effectively averaged out with respect to the amplifier output.

Now consider that switches S5 and S6 operate at onehalf the S1-S4 switch rate. In this instance for each half cycle of the S5-S6 rate transistor Q1 is connected for successive quarter cycles to transistors Q3 and Q4 and transistor Q2 is alternately connected for successive quarter cycles to transistors Q4 and Q3. During the first half cycle of the S5-S6 switching period when Q1 is connected to the positive input terminal 10, the collector of Q1 is connected to transistor Q3. On the second half cycle of the S5-S6 switch period when Q1 is again connected to the positive input terminal 10 the collector electrode of Q1 is connected to transistor Q4. Thus for the S5-S6 rate equal to one-half the S1-S4 rate it takes two cycles of switching S1-S4 to produce an effective averaged load condition on transistors Q1 and Q2 as for switches S5 and S6 operated at twice the rate as switches S1-S4.

Figure 2:
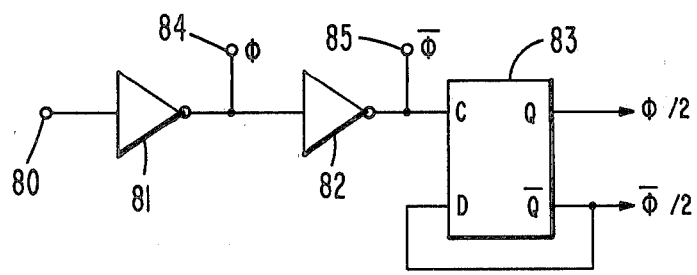
FIG. 2 is a block diagram of circuitry for generating clocked potentials for synchronously operating the switches in the FIG. 1 circuit.

FIG. 2 illustrates an example of a circuit for generating clocked signals for operating the switches S1-S6. Elements 81 and 82 are high gain logic inverters and element 83 is a conventional D-type flip-flop. A signal of frequency fo and having a 50 percent duty cycle, e.g., a sinusoid, is applied to input terminal 80. Inverter 81 converts the sinusoid to a square wave (by virtue of its high gain) at terminal 84. This square wave has predetermined positive and negative potential limits which potentials are substantially unaffected by changes in input signal amplitude at terminal 80. Inverter 82 receives the output signal from inverter 81 and produces a signal 180 degrees out of phase therewith at its output terminal 85. The signals at terminals 84 and 85 are of substantially equal amplitude and are complementary.

The output signal (squarewave) from inverter 82 is applied to the clock input of D type flip flop 83. Flip flop 83 having its D input connected to its $\overline{Q}$ output terminal is configured as a divide-by-two circuit with respect to signals applied to its clock input terminal. As arranged in FIG. 2, flip flop 83 will produce complementary signals at its Q and $\overline{Q}$ output terminals which are equal in amplitude with the signals produced at inverter output terminals 84 and 85 and having a frequency of one-half these signals. The FIG. 2 circuit produces two sets of complementary signals differing in frequency by a factor of two which are applicable for energizing the set of switches S5-S6 and the set of S1-S4 in any desirable amplifier operating mode.

Figure 3:
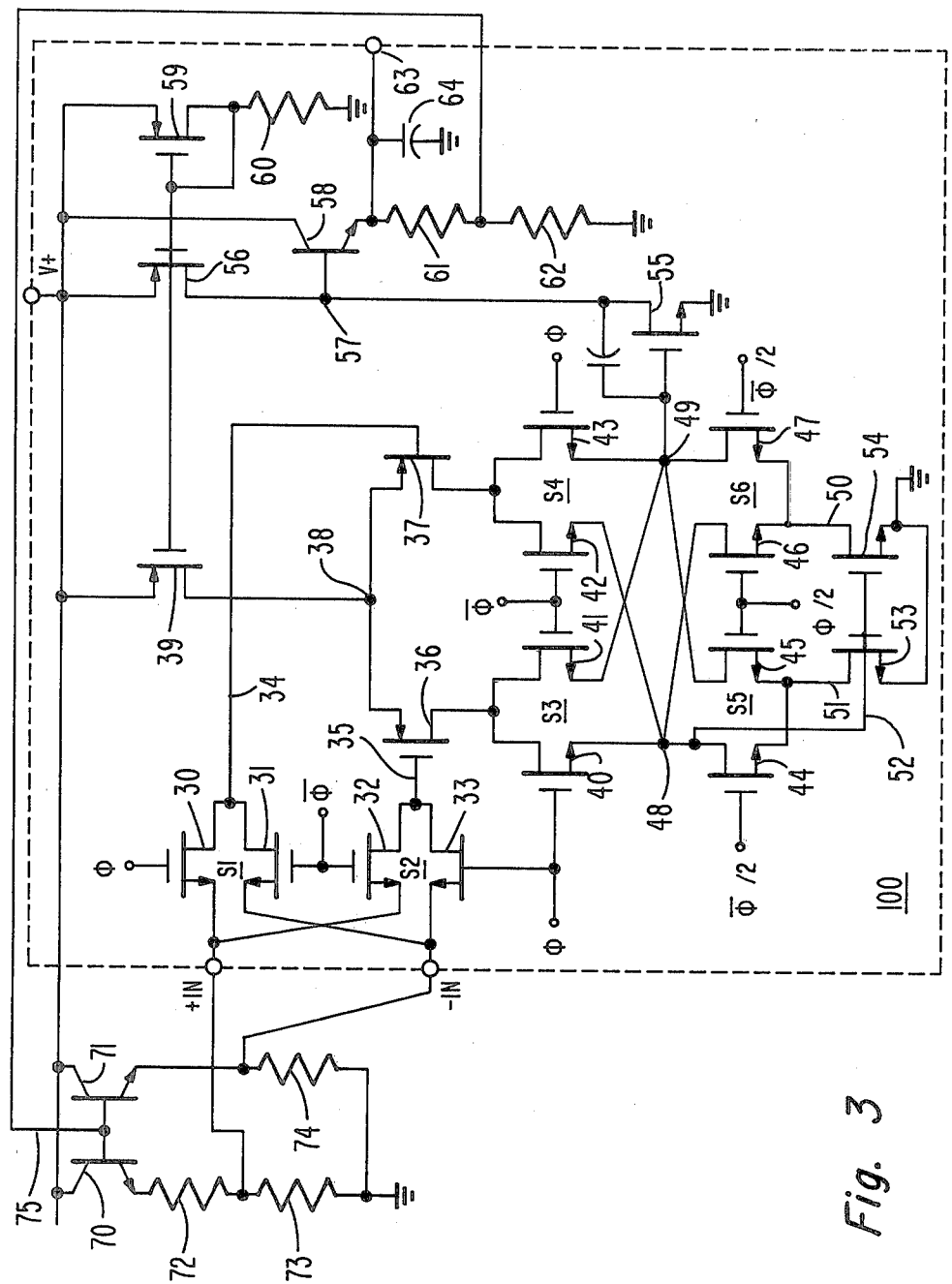
FIG. 3 is a schematic diagram of a particular amplifier circuit embodying the present invention and incorporated in a bandgap reference circuit.

FIG. 3 is a bandgap reference circuit utilizing an amplifier 100 of the type set forth in FIG. 1 and the foregoing discussion, but realized using metal-oxide-semiconductor (MOS) field-effect-devices (FETs).

Transistors 70 and 71 in combination with resistors 72-74 are arranged to produce a temperature insensitive reference potential. The common-collector amplifier transistors 70 and 71 are arranged to maintain their base-emitter junction current densitites in a prescribed ratio. The difference in current density generates a difference in base-emitter potential between transistors 70 and 71, transistor 71 having the larger base-emitter potential, with the difference being developed or dropped across resistor 72. The base-emitter potential difference across resistor 72 has a positive temperature coefficient due to the divergence of the base-emitter potentials as temperature increases. This potential is multiplied on resistor 73 and summed with the negative-temperature coefficient base-emitter potential of transistor 70 by virtue of high gain amplifier 100 to produce a reference voltage substantially independent of temperature. For a detailed discussion of this reference circuit, see U.S. Pat. No. 4,263,519.

The ratio of current densities in transistors 70 and 71 is maintained constant by comparing the potentials developed across resistors 73 and 74, respectively connected in the emitter circuits of transistors 70 and 71, and applying a feedback potential to the base electrodes of the transistors tending to produce an essentially zero amplifier differential input potential. It can be demonstrated that this circuit arrangement will produce a substantially constant reference potential over a range of temperatures if the amplifier offset and resistor tracking are temperature invariant. It should be appreciated that a time and temperature varying amplifier offset will detrimentally affect the constancy of the reference potential thereby requiring a highly stable feedback amplifier.

Amplifier 100 is essentially an FET analog of the circuit illustrated in FIG. 1 with the switches S1-S6 realized with FET transistors. For purposes of this disclosure, the theory of operation of the amplifier 100 is identical with the FIG. 1 circuit operation.

In the Figure, transistor 39 is coupled with transistor 59 to form a current source for supplying tail current to the differential transistor pair comprising p-type transistors 36 and 37. Transistors 36 and 37 have their respective drain electrodes commutated and connected via switches S3-S6 to n-type transistors 53 and 54 configured as a CMA active load circuit for the differential amplifier stage. Connection 49 forms an output connection for the differential stage which is connected to a common source amplifier comprising amplifying n-type transistor 55 and the current source load provided by p-type transistor 56. Output signal from the drain connection 57 of transistor 55 is buffered by the emitter follower amplifier including transistor 58 with emitter resistors 61 and 62.

In this bandgap reference arrangement, feedback to the base electrodes of transistors 70 and 71 is taken from the interconnection of resistors 61 and 62 rather than from the amplifier output terminal 63. As a result, a potential which is greater than the nominal 1.25 volt bandgap potential is made available at the amplifier output terminal 63, e.g., if resistors 61 and 62 are equal, a reference potential of 2.5 volts will be available at terminal 63. The respective switches S1-S6 for commutating potentials and load elements in the amplifier 100 are each comprised of a pair of transistors alternately operated in the "on" or "off" state. Switch S1 includes transistors 30 and 31, switch S2 includes transistors 32 and 33, etc. The control or gate electrodes of the two transistors of a switch pair are pulsed with complementary clocked potentials $\phi$, $\overline{\phi}$, enabling the drain-source or principal conduction path of the respective transistors to alternately conduct at a 50% duty rate. Considering the switch S1, n-type transistors 30 and 31 are conditioned to conduct when the potentials applied to their respective gate electrodes are more positive than the potential at their respective source electrodes. Thus, for complementary clocks applied to their respective gates, during one-half cycle of a clock period transistor 30 is conditioned to conduct closing the circuit between connection 34 and the (+)in input terminal and during the second half cycle transistor 31 is conditioned to conduct closing the circuit between connection 34 and the (−)in input terminal, commutating the two input potentials to the gate electrode of transistor 32 comprising one transistor of the differential pair. In similar fashion transistors 33 and 32 of switch S2 are alternately conditioned to conduct to commutate the potentials at the (−)in and (+)in terminals to the gate electrode of transistor 36, the other transistor comprising the differential pair. During the half cycles the respective transistors are non-conducting, they exhibit an extremely high drain-source impedance, effectively creating an open circuit.

In similar fashion each of the remaining transistors of the respective switch pairs S3-S6 are alternately conditioned to conduct by the application of complementary clocks to their respective gates. Typically there will exist some degree of coupling of the clock potentials from the respective gate electrodes to the drain and source electrodes of the switching transistors. However, if care is taken to insure that the clocks are truly complementary the coupling of a positive going clock potential applied to one transistor of a switch pair will be cancelled by the negative-going complementary clock potential applied to the gate electrode of the other transistor of the switch pair.

What is claimed is:

1. A differential amplifier circuit comprising;
   inverting and non-inverting input terminals and an output terminal;
   a differential transistor pair having first and second input terminals and first and second output terminals;
   first and second load means;
   first means for alternately connecting said first load means to said first and second output terminals of the differential transistor pair and concurrently alternately connecting said second load means to said second and first output terminals of the differential transistor pair at a first cyclic rate, said first and second load means and said differential transistor pair thereby forming a differential amplifier stage, the load presented to each output terminal of the differential pair being the time average of the first and second load means;
   second means for alternately connecting said inverting input terminal to the first and second input terminals of the differential pair and concurrently alternately connecting the non-inverting input terminal to the second and first input terminals of the differential pair at a second cyclic rate; and
   third means alternately connecting the first and second output terminals of said differential transistor pair to said output terminal at said second cyclic rate, the alternate connection of input terminals, output terminals and load means tending to average out offsets in the circuitry and thereby reducing DC input offset and drift.

2. A differential amplifier comprising:
   first and second signal input terminals and an output terminal;
   first and second transistors of a first conductivity type and fourth and third transistors of a second conductivity type complementary to said first conductivity type, each transistor having respective first and second electrodes and respective principal conduction paths therebetween, having respective control electrodes, the principal conduction path of each transistor being controlled by potential applied between its respective control and first electrode;

a current source;

means interconnecting the first electrodes of said first and second transistors and said current source as a differential amplifier input transistor pair;

means connecting the first electrodes of the third and fourth transistors;

means for commutating at a first rate, connection of the respective second electrodes of the fourth and third transistors to the second electrodes of the first and second transistors, said third and fourth transistors arrange to operate as active load devices for said differential transistor pair;

means for commutating at a second rate, connection of the first and second signal input terminals respectively to the control electrodes of the first and second transistor; and means for commutating at said second rate, connection of the second electrodes of said first and second transistors to said output terminal.

3. The amplifier set forth in claim 2 wherein the means for commutating connection of the second electrodes of the third and fourth transistors to the second electrodes of the first and second transistors includes;

a first node;

a second node connected to said output terminal; first switch means for alternately connecting the second electrode of the third transistor to said first and second nodes;

second switch means for alternately connecting the second electrode of the fourth transistor to the second and first nodes, said first and second nodes being respectively connected to the second electrodes of one of said first and second transistors; and means for synchronously operating said first and second switch means.

4. The amplifier set forth in claim 3 further including means for connecting the control electrodes of the third and fourth transistors to said first node thereby configuring said third and fourth transistors as a current mirror amplifier load means.

5. The amplifier set forth in claim 3 wherein the means for commutating connection of the second electrodes of the first and second transistors to the output terminal includes:

third switch means for alternately connecting the second electrode of the first transistor to said first and second nodes;

fourth switch means for alternately connecting the second electrode of the second transistor to said second and first nodes; and further means for synchronously operating said third and fourth switch means, which means operates synchronously with said first and second switch means but at a cyclic rate which is a multiple thereof.

6. The amplifier set forth in claim 5 wherein the means for commutating connection of the first and second input terminals with the control electrodes of the first and second transistors includes:

fifth switch means for alternately connecting the first and second input terminals to the control electrode of the first transistor;

sixth switch means for alternately connecting the second and first input terminals to the control electrode of the second transistor;

means for operating the fifth and sixth switches in synchronism with and at the same cyclic rate as said third and fourth switches.

7. The amplifier set forth in claim 3 or 4 or 5 or 6 wherein each of the respective switch means comprises:

first, second and third terminals;

first and second further transistors, each having respective first, second and control electrodes;

means for connecting the respective control electrodes of the first and second further transistors to the respective means for synchronously operating the respective switch means;

means connecting one of the first and second electrodes of the first further transistor and one of the first and second electrodes of the second further transistor to said first terminal;

means connecting the other of said first and second electrodes of said first further transistor to said second terminal; and means connecting the other of said first and second electrodes of said second further transistor to said third terminal, said first and second further transistors for selectively closing a circuit between the first and second switch terminals and the first and third switch terminals respectively.

* * * * *